United States Patent [19]

McDavid

[11] Patent Number: 4,736,233

[45] Date of Patent: Apr. 5, 1988

[54] INTERCONNECT AND CONTACT SYSTEM FOR METAL-GATE MOS VLSI DEVICES

[75] Inventor: James M. McDavid, Dallas, Tex.

[73] Assignee: Texas Instruments Incorporated, Dallas, Tex.

[21] Appl. No.: 624,166

[22] Filed: Jun. 25, 1984

[51] Int. Cl.[4] ............................................ H01L 29/78
[52] U.S. Cl. ................................ 357/23.9; 387/71; 387/91; 387/41
[58] Field of Search ................ 357/23.9, 71, 91, 41

[56] References Cited

U.S. PATENT DOCUMENTS 4,141,222  2/1979  Sigg et al. .......................... 357/23.9
4,384,301  5/1983  Tasch et al. ....................... 357/23.9

Primary Examiner—Joseph E. Clawson, Jr.
Attorney, Agent, or Firm—John G. Graham

[57] ABSTRACT

A simplified process for metal gate and contact/interconnect system for MOS VLSI devices employs a refractory metal structure for the gate, including a thick layer of tungsten alone, with stress and adhesion controlled by the deposition conditions. The metal gate receives sidewall oxide spacers during a metal-cladding operation for the source/drain areas. Contacts to the source/drain region include a molybdenum/tungsten stack and a top layer of gold.

4 Claims, 1 Drawing Sheet

INTERCONNECT AND CONTACT SYSTEM FOR METAL-GATE MOS VLSI DEVICES

BACKGROUND OF THE INVENTION

This invention relates to the manufacture of semiconductor devices, and more particularly to a metallization system for gates, contacts and interconnects in MOS VLSI devices.

In the manufacture of MOS VLSI devices such as high density dynamic RAMs or the like, the use of metal gates and interconnects has become necessary due to the resistance of previously-used polycrystalline silicon. When the width of the gates, conductors, etc., is reduced to the one micron range, and the thickness also reduced to avoid step coverage problems, then the use of metal instead of polysilicon becomes mandatory. The selection of a single metal to perform the gate, contact and interconnect functions results in a number of compromises. Thus, multiple metal systems have evolved. Yet, the problems of contact resistance, adherance to oxide, process incompatability, electromigration, and other factors have limited the utility of the prior systsms due to one or more shortcomings.

It is the principal object of the invention to provide an improved method of making metal-gate MOS VLSI devices, particularly high density memory cell arrays or the like. Another object is to provide an improved contact and interconnect system and metal-gate transistor structure as may be used in very high density memory arrays. A further object is to provide an improved metallization system with low contast and sheet resistance, good adhesion, good electromigration resistance, and minimal process and materials complexity.

SUMMARY OF THE INVENTION

In accordance with the embodiment of the invention, a simplified process for metal gate and contact/interconnect system for MOS VLSI devices employs a refractory metal structure for the gate, including a thick layer of tungsten alone, with stress and ashesion controlled by the deposition conditions. The metal gate receives sidewall oxide spacers during a metal-cladding operation for the source/drain areas. Contacts to the source/drain region include a molybdenum/tungsten stack and a top layer of gold.

BRIEF DESCRIPTION OF THE DRAWINGS

The novel feature beleived characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
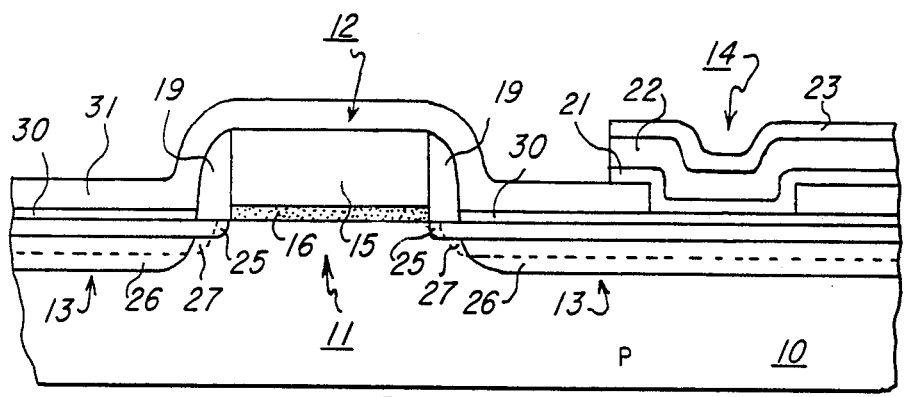
FIG. 1 is an elevation view in section, greatly enlarged, of a very small part of a semiconductor integrated circuit chip, showing the contact and interconnect structure of the invention.

Referring to FIG. 1, a semiconductor device is illustrated using the contact system of the invention. A silicon substrate 10 has a metal-gate MOS transistor 11 formed thereon, with the transistor having a gate 12, multiple implanted source/drain regions 13, and a metal-to-silicon contact 14 to one of the source/drain regions. It is understood, of course, that there would be hundreds of thousands of such transistors and like structures in a single chip. This metallization structure is particularly useful for high density dynamic RAMs, such as the 1-Megabit DRAM, where the minimum dimensions are about one or two microns.

According to the invention, the gate 12 and the contact 14 are composed of particular layers of metals. The gate has a relatively thick layer of tungsten 15 over a thin gate oxide 16. The single layer 15 of tungsten mask the source/drain implants. The adhesion of tungsten to the gate oxide is in this case controlled by the deposition conditions, and this simplified version applies to the use of selective CVD-tungsten cladding of source/drain areas as will be described.

Sidewall oxide segments 19 are used for spacing the source/drain implant from the edge of the gate to provide a lightly-doped drain structure.

The metal-to-silicon contact 14 of course must be formed after the metal gate 15 has been completed. The contact 14 consists of first a thin molybdenum layer 21, followed by a tungsten layer 22 (like the tungsten layer 15) and a gold layer 23 on top.

The source/drain implant arrangement for creating the regions 13 includes first a shallow, low-concentration N implant 25 self-aligned with the edges of the gate 15 before the sidewall oxide 19 is in place. Then, after the sidewall oxide has been formed, a deep, high concentration N+ arsenic implant produces a deep region 26, and a lower-concentration phosphorus implant diffuses faster and creates a reach-through N region 27. This implant sequence provides a lightly doped drain structure to minimize the effects of impact ionization, but yet provides a relatively low series resistance to the edge of the channel (due to implant 25), and a heavily doped, low resistance area away from the transistor where the contact 14 is to be made.

Alternatively instead of siliciding the source/drain areas as has been done previously, a layer 30 of CVD-tungsten metal of about 500 Å thickness is selectively deposited only on the exposed silicon areas, thus circumventing the silicide reaction step and the removal step for unreacted metal on oxide areas. In this case, the source/drain (or moat) areas are clad with pure tungsten metal 30 rather than silicide.

A silicon oxide layer 31 is deposited over the gate and the clad source/drain areas, and an opening defined in this oxide for the contact 14.

The various materials and structures in this metallization and contact system are selected for the objectives of low contact and line resistance, good adhesion, good electromigration resistance, and minimal process and material complexity. Deposition methods are low damage and high purity, as required.

The tungsten metal 30 on the exposed silicon source/drain or "moat" areas is needed to lower the sheet resistance of these areas while allowing the source/drain regions 13 to be quite shallow, necessary for scaled devices, i.e., of small dimensions. The gate 12 is composed of the tungsten layer 15 of which is 3000 Å thick but the tungsten 15 is treated to increase its adhesion to the silicon oxide coating 16. The contact 14 employs the thin molybdenum layer 21 is needed over the oxide 31 to promote adhesion, so the layer 20 must be limited to only the contact hole. The bulk of the contact and interconnect is the tungsten layer 22 which is 7000 Å in thickness. The gold layer 23 is added for its very high conductivity, its malleability in bonding wires to it at bonding pads, and its non-reactive and electromigration properties. For less demanding applications the gold may be omitted. The thickness of this gold cladding is about 4000 Å.

Figure 2:
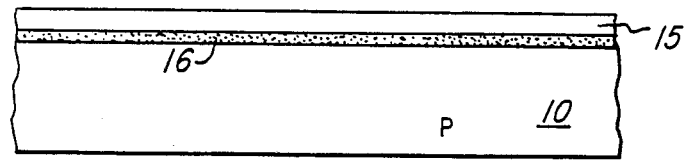
FIGS. 2-4 are elevation views in section of the device of FIG. 1, at successive stages in the manufacture thereof.
Figure 3:
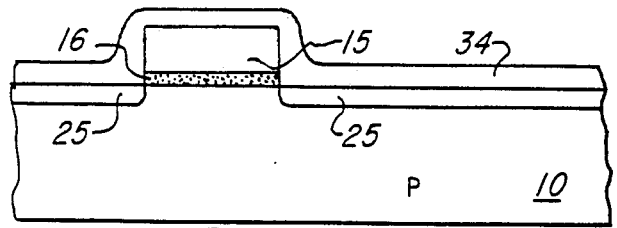
Figure 4:
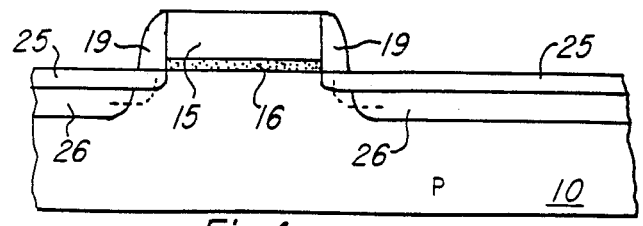

A method of constructing the device of FIG. 1 according to the invention will be described with reference to FIGS. 2-4. First the gate oxide 16 is thermally grown to a thickness of perhaps 200 to 300 Å on a suitably prepared surface of a silicon slice. It is understood that this contact and interconnect arrangement may be part of a CMOS process, using N wells and field oxide and/or field plate isolation between elements on the face, so there are many process steps unrelated to the structure of FIG. 1 that would be previously implemented. The tungsten layer 15 is deposited over the gate oxide 16 to a thickness of about 5000 Å, and this multilayer structure is patterned by a photolithographic process to leave the gate stack of FIG. 3. The shallow arsenic implant 25 is now performed at low dosage. Thereafter a layer 34 of oxide is applied over the entire face by deposition, then this layer is anistropically etched to leave only the sidewall segments 19 (seen in FIG. 1). The deep arsenic implant 26 is now performed, along with the phosphorus implant 27 and annealed for drive in, as seen in FIG. 4. The deep, high concentration arsenic implant is self-aligned with the sidewalls 19, whereas the phosphorus diffused laterally beneath the sidewalls. Analogous processing applies for p-channel devices in a CMOS circuit.

The next step in the process is applying the layer 30 which is pure tungsten metal; this is deposited by CVD-selective-tungsten deposition to a thickness of 500 Å on the exposed silicon moat areas only. The reaction step for siliciding and the metal stripping step for metal on oxide areas needed in the prior methods are not used, since tungsten metal is deposited selectively on silicon but not on oxide.

The oxide 31 is next deposited to a thickness of about 8000 Å, and photo resist is applied and exposed for the purpose of etching the hole for the contact 14. After the oxide 31 is etched here, the layers of molybdenum 21, tungsten 22 and gold 23 are deposited and the stack is patterned, leaving the structure of FIG. 1.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therfore contemplated that the appended claims will cover any such modifications or embodiments as fall within the true scope of the invention.

What is claimed:

1. A gate, contact and interconnect structure for an MOS integrated circuit, comprising:
   a metal gate on a face of a silicon body comprising a layer of tungsten overlying and adhered to a thin layer of silicon oxide, and a coating of oxide on the sidewalls of said gate totally encapsulating said gate;
   heavily-doped source/drain regions in said face self-aligned with said oxide on the sidewalls of the metal gate,
   a tungsten metal layer formed on the surface of said source/drain regions self-aligned with said oxide on the sidewalls of the metal gate,
   a thick deposited insulator coating on said face over said metal gate and over said tungsten metal layer and source/drain regions,
   a metal contact and interconnect strip extending along said face overlying said insulator coating and extending into a contact hole in said insulator coating to make electrical connection to said tungsten metal layer, and comprising:
   a thin layer of molybdenum over said insulator coating, a thicker layer of tungsten over said molybdenum, and a layer of gold over said thicker layer of tungsten.

2. A device according to claim 1 wherein said source/drain regions include shallow regions self-aligned with said metal gate before said sidewall oxide is applied.

3. A device according to claim 1 wherein said body is P type, and said source/drain regions are N+ type.

4. A device according to claim 1 wherein said layer of tungsten of the metal gate is much thicker than said layer of molybdenum of the metal contact.

* * * * *